US008300835B2

(12) United States Patent
Ohta et al.

(10) Patent No.: US 8,300,835 B2

(45) Date of Patent: Oct. 30, 2012

(54) AUDIO SIGNAL PROCESSING APPARATUS, AUDIO SIGNAL PROCESSING METHOD, AUDIO SIGNAL PROCESSING PROGRAM, AND COMPUTER-READABLE RECORDING MEDIUM

(75) Inventors: Yoshiki Ohta, Saitama (JP); Kensaku Obata, Saitama (JP)

(73) Assignee: Pioneer Corporation, Tokyo (JP)

( * ) Notice: Subject to any disclaimer, the term of this patent is extended or adjusted under 35 U.S.C. 154(b) by 1253 days.

(21) Appl. No.: 11/994,067

(22) PCT Filed: Jun. 14, 2006

(86) PCT No.: PCT/JP2006/311947

§ 371 (c)(1), (2), (4) Date: Dec. 27, 2007

(87) PCT Pub. No.: WO2007/004397

PCT Pub. Date: Jan. 11, 2007

(65) Prior Publication Data

US 2009/0232321 A1 Sep. 17, 2009

(30) Foreign Application Priority Data

Jul. 1, 2005 (JP) ................................ 2005-194413

(51) Int. Cl.
*H01L 29/00* (2006.01)

(52) U.S. Cl. ........................................................ 381/58

(58) Field of Classification Search ..................... 381/58
See application file for complete search history.

(56) References Cited

U.S. PATENT DOCUMENTS

| | | | | |
|---|---|---|---|---|
| 5,065,432 | A | 11/1991 | Sasaki et al. | |
| 5,815,580 | A * | 9/1998 | Craven et al. | 381/58 |
| 5,910,995 | A * | 6/1999 | Mercs et al. | 381/106 |
| 2004/0030546 | A1 * | 2/2004 | Sato | 704/207 |
| 2008/0071136 | A1 * | 3/2008 | Oohashi et al. | 600/27 |

FOREIGN PATENT DOCUMENTS

| | | | |
|---|---|---|---|
| JP | 1-144900 | A | 6/1989 |
| JP | 2-121500 | A | 5/1990 |
| JP | 2001-85962 | A | 3/2001 |
| JP | 2005-141121 | A | 6/2005 |

* cited by examiner

*Primary Examiner* — Charles Garber
*Assistant Examiner* — Andre' C Stevenson
(74) *Attorney, Agent, or Firm* — Foley & Lardner LLP

(57) ABSTRACT

An audio signal processing apparatus includes a cutout unit, a correlation calculating unit, a spectrum calculating unit, a coefficient calculating unit, and an assigning unit. The cutout unit cuts out audio signals of plural channels by a time frame. The correlation calculating unit calculates a correlation value between respective signals of the plural channels included in a predetermined time frame cut out by the cutout unit. The spectrum calculating unit calculates spectrum information indicative of spectral characteristics concerning a signal of a given channel cut out by the cutout unit. The coefficient calculating unit calculates a coefficient to be multiplied by the signal of the given channel, based on the correlation value and the spectrum information. The assigning unit multiplies the coefficient by the signal of the given channel and assigns the multiplied signal to channels other than the given channel.

13 Claims, 5 Drawing Sheets

AUDIO SIGNAL PROCESSING APPARATUS, AUDIO SIGNAL PROCESSING METHOD, AUDIO SIGNAL PROCESSING PROGRAM, AND COMPUTER-READABLE RECORDING MEDIUM

TECHNICAL FIELD

The present invention relates to an audio signal processing apparatus, an audio signal processing method, an audio signal processing program, and a computer-readable recording medium, that reproduce sound with sound effects added by processing an audio signal. However, utilization of the present invention is not limited to the above-mentioned audio signal processing apparatus, audio signal processing method, audio signal processing program, and computer-readable recording medium.

BACKGROUND ART

Acoustic equipment that reproduces sound with added sound effects by processing a multi-channel audio signal is in wide use. For example, there is a technology that analyzes the contents of a piece of music and automatically sets an equalizer to optimal equalization characteristics in the acoustic equipment. In this technology, when the music conforms to a pattern of hand clapping at the beginning and at the end, the music is judged to be recorded live and the equalizer is set for a live recording (see, for example, Patent Document 1).

Patent Document 1: Japanese Patent Application Laid-Open Publication No. 2001-85962

DISCLOSURE OF INVENTION

Problem to be Solved by the Invention

However, generally, surround components of 5.1 channel, etc., other than the sound to be definitely oriented in the rear, often include non-correlated signals to mimic the ambience of a live music hall. Typical sound processing by an equalizer or a reverberator, when applied to music itself, makes the sound unnatural. For this reason, conventionally, it has been earnestly desired that the processing may be applied only to such components that will give the ambience of a live music hall. One example is a problem in that while the original object of the equalizer is to arrange transfer characteristics from a speaker to a listener, thought was not given to adding the sound effects to components other than the music sound.

Means for Solving Problem

An audio signal processing apparatus according to an embodiment of the invention includes a cutout unit that cuts out audio signals of plural channels by time frame; a correlation calculating unit that calculates a correlation value between respective signals of the plural channels included in a predetermined time frame cut out by the cutout unit; a spectrum calculating unit that calculates spectrum information indicative of spectrum characteristics with respect to a signal of a predetermined channel cut out by the cutout unit; a coefficient calculating unit that calculates a coefficient to be multiplied by the signal of the predetermined channel, based on the correlation value calculated by the correlation calculating unit and the spectrum information calculated by the spectrum calculating unit; and an assigning unit that multiplies the coefficient calculated by the coefficient calculating unit by the signal of the predetermined channel and assigns the multiplied signal to other channels than the predetermined channel.

An audio signal processing method according to an embodiment of the invention includes a cutout step of cutting out audio signals of plural channels by time frame; a correlation calculating step of calculating a correlation value between respective signals of the plural channels included in a predetermined time frame cut out by the cutout unit; a spectrum calculating step of calculating spectrum information indicative of spectrum characteristics with respect to a signal of a predetermined channel cut out by the cutout unit; a coefficient calculating step of calculating a coefficient to be multiplied by the signal of the predetermined channel, based on the correlation value calculated by the correlation calculating unit and the spectrum information calculated by the spectrum calculating unit; and an assigning step of multiplying the coefficient calculated by the coefficient calculating unit by the signal of the predetermined channel and assigning the multiplied signal to other channels than the predetermined channel.

An audio signal processing program according to an embodiment of the invention causes a computer to execute the audio signal processing method.

A computer-readable recording medium according to an embodiment of the invention stores therein the audio signal processing program.

EXPLANATIONS OF LETTERS OR NUMERALS

Figure 1:
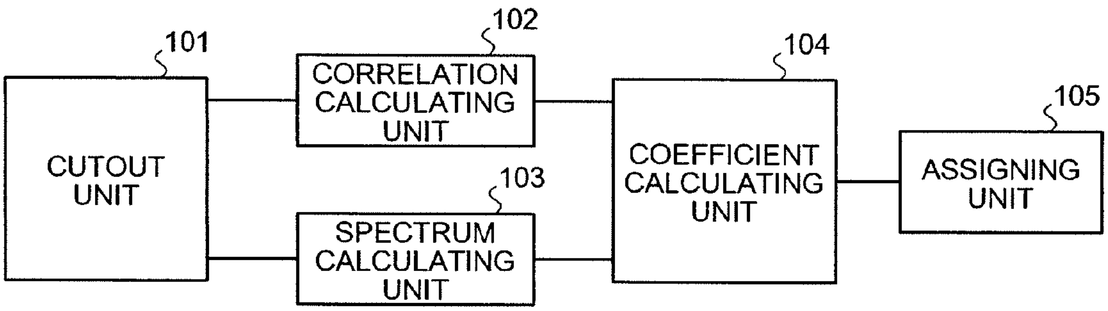
FIG. 1 is a block diagram of a functional configuration of an audio signal processing apparatus according to an embodiment of the present invention.

101 cutout unit
102 correlation calculating unit
103 spectrum calculating unit
104 coefficient calculating unit
105 assigning unit
301 sound source
302 DSP
303 microcomputer
304 D/A converter
305 amplifier
306 speaker
401 coefficient controller
402, 403 multiplying unit
404, 405 filter
502, 512 time frame cutout unit
520 correlation calculating unit
530, 531 spectral range calculating unit

540 timer

550 coefficient calculating unit

601, 611 spectrum calculating unit

620 coefficient calculating unit

BEST MODE(S) FOR CARRYING OUT THE INVENTION

Referring to the accompanying drawings, exemplary embodiments of a audio signal processing apparatus, a audio signal processing method, a audio signal processing program, and a computer-readable recording medium, according to the present invention, with reference to accompanying drawings will be described below.

FIG. 1 is a block diagram of a functional configuration of the audio signal processing apparatus according to an embodiment of the present invention. The audio signal processing apparatus according to the embodiment comprises a cutout unit 101, a correlation calculating unit 102, a spectrum calculating unit 103, a coefficient calculating unit 104, and an assigning unit 105.

The cutout unit 101 cuts out audio signals of plural channels by a time frame. The cutout unit 101 is also capable of cutting out the audio signals of plural channels by windowing the audio signals in a time scale. The correlation calculating unit 102 calculates a correlation value between the respective signals of the plural channels included in a predetermined time frame cut out by the cutout unit 101. The spectrum calculating unit 103 calculates spectrum information indicative of spectrum characteristics with respect to the signal of a predetermined channel cut out by the cutout unit 101.

The coefficient calculating unit 104 calculates a coefficient to be multiplied by the signal of the predetermined channel, based on the correlation value calculated by the correlation calculating unit 102 and the spectrum information calculated by the spectrum calculating unit 103. The coefficient calculating unit 104 is also capable of calculating a value inversely proportional to the correlation value as such a coefficient. The assigning unit 105 multiplies the coefficient calculated by the coefficient calculating unit 104 by the signal of the predetermined channel and assigns this multiplied signal to channels other than the predetermined channel.

The spectrum calculating unit 103 is capable of calculating a spectral range of the signal of the predetermined channel. In this case, the coefficient calculating unit 104 is also capable of calculating a value proportional to the value obtained by dividing the spectral range by the time length of the time frame as the coefficient. The coefficient calculating unit 104 is also capable of calculating, as the coefficient, a value proportional to the total value obtained by adding a value inversely proportional to the time from the starting point of the time frame and a value inversely proportional to the time to the ending point of the time frame.

The spectrum calculating unit 103 is capable of calculating a spectrum of the signal of the predetermined channel. In this case, the coefficient calculating unit 104 is also capable of calculating, as the coefficient, a value inversely proportional to a difference of the spectrum in the signal of the predetermined channel from a target spectrum.

The audio signals of the plural channels may include signals of a front left channel, a front right channel, a center channel, a surround left channel, and a surround right channel, respectively. In this case, when the coefficient calculating unit 104 calculates the coefficient with respect to the surround left channel, the assigning unit 105 may assign the signal to the front left channel, the front right channel, the center channel, and the surround right channel, respectively. In this case, when the coefficient calculating unit 104 calculates the coefficient with respect to the surround right channel, the assigning unit 105 may also assign the signal to the front left channel, the front right channel, the center channel, and the surround left channel, respectively.

Figure 2:
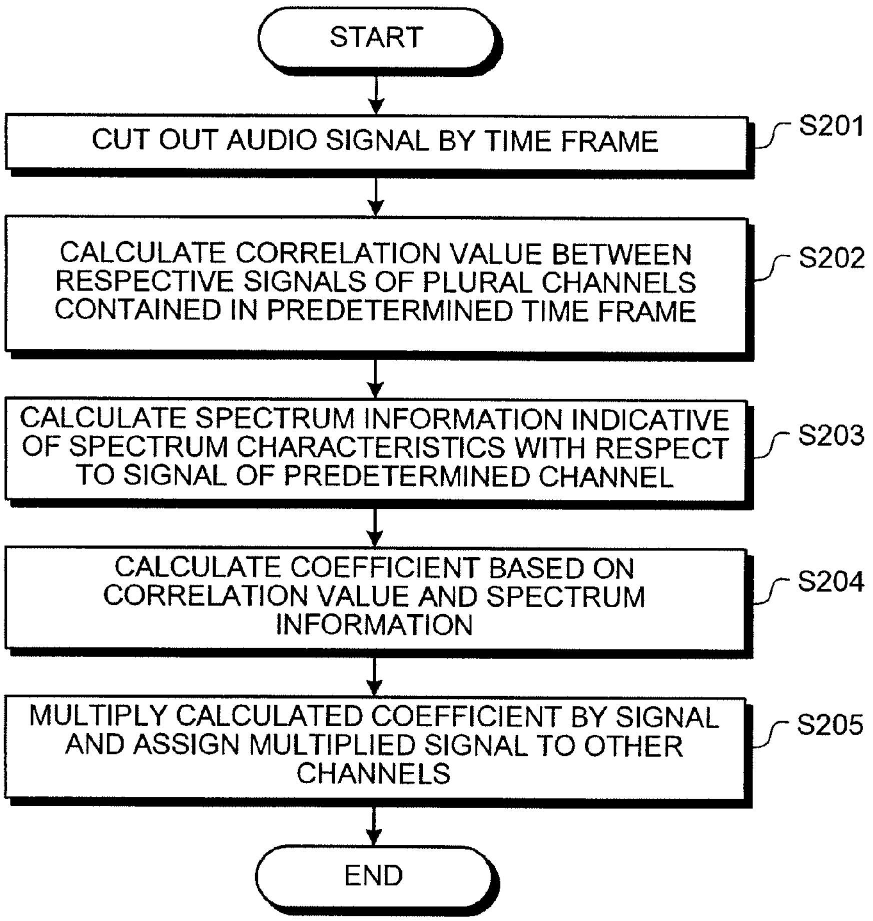
FIG. 2 is a flowchart of processing of an audio signal processing method according to the embodiment of the present invention.

FIG. 2 is a flowchart of processing of a audio signal processing method according to the embodiment of the present invention. Firstly, the cutout unit 101 cuts out the audio signals of the plural channels by the time frame (step S201). The correlation calculating unit 102 calculates the correlation value between respective signals of the plural channels included in the predetermined time frame cut out by the cutout unit 101 (step S202). The spectrum calculating unit 103 calculates the spectrum information indicative of the spectrum characteristics with respect to the signal of the predetermined channel cut out by the cutout unit 101 (step S203).

The coefficient calculating unit 104 calculates the coefficient based on the correlation value calculated by the correlation calculating unit 102 and the spectrum information calculated by the spectrum calculating unit 103 (step S204). This coefficient is the coefficient to be multiplied by the signal of the predetermined channel. The assigning unit 105 multiplies the coefficient calculated by the coefficient calculating unit 104 by the signal of the predetermined channel and assigns this multiplied signal to channels other than the predetermined channel (step S205).

The embodiment described above enables assignment of a particular component to another channel according to the correlation between the channels and the spectrum characteristics. For example, a component other than the music may be extracted out of the surround component. For example, by assigning a component other than the music to the front channel, the ambience of listening to live music and being surrounded by hand clapping may be given to the listener.

EXAMPLES

First Example

Figure 3:
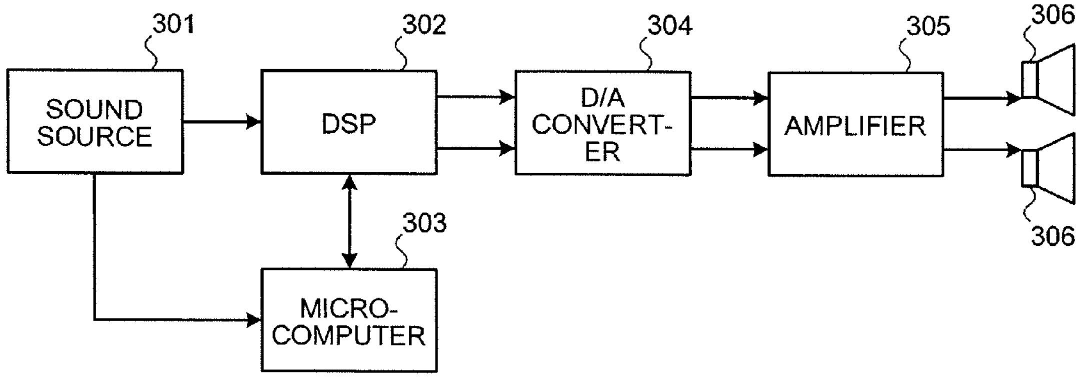
FIG. 3 is a block diagram of a configuration of the audio signal processing apparatus according to the present example.

FIG. 3 is a block diagram of a configuration of the audio signal processing apparatus according to the present invention. A sound source 301 outputs a digital signal describing a audio signal. The sound source 301 may be recorded, for example, by ripping on a package medium such as a DVD and a CD or an HDD. Data format of the digital signal may be that of a stereo sound source or a multi-channel sound source such as the 5.1 channel.

A DSP (Digital Signal Processor) 302 receives the digital signal from the sound source 301 as a source and adds sound effects thereto. Here, the DSP 302 exchanges information about the sound source 301 with a microcomputer 303 and, depending on contents thereof, may change the contents of the processing. The DSP 302, internally calculates a processing coefficient in accordance with acoustic properties of the sound source 301 and the information obtained from the microcomputer 303. This audio signal processing apparatus usually uses signal processing such as by an equalizer and a reverberator. However, these methods, using a fixed coefficient irrespective of the kind of music, can not necessarily make reproduction according to characteristics of the music.

A D/A converter 304 converts the signal output from the DSP 302 to an analog signal. The converted analog signal is amplified by an amplifier 305 and is acoustically reproduced by a speaker 306.

As described above, in the audio signal processing apparatus, the signal from the sound source 301 is received by the DSP 302, which performs the signal processing of the signal in cooperation with the microcomputer 303. This signal-processed signal is converted by the D/A converter to an analog signal and is acoustically reproduced by the amplifier 305 and the speaker 306.

Figure 4:
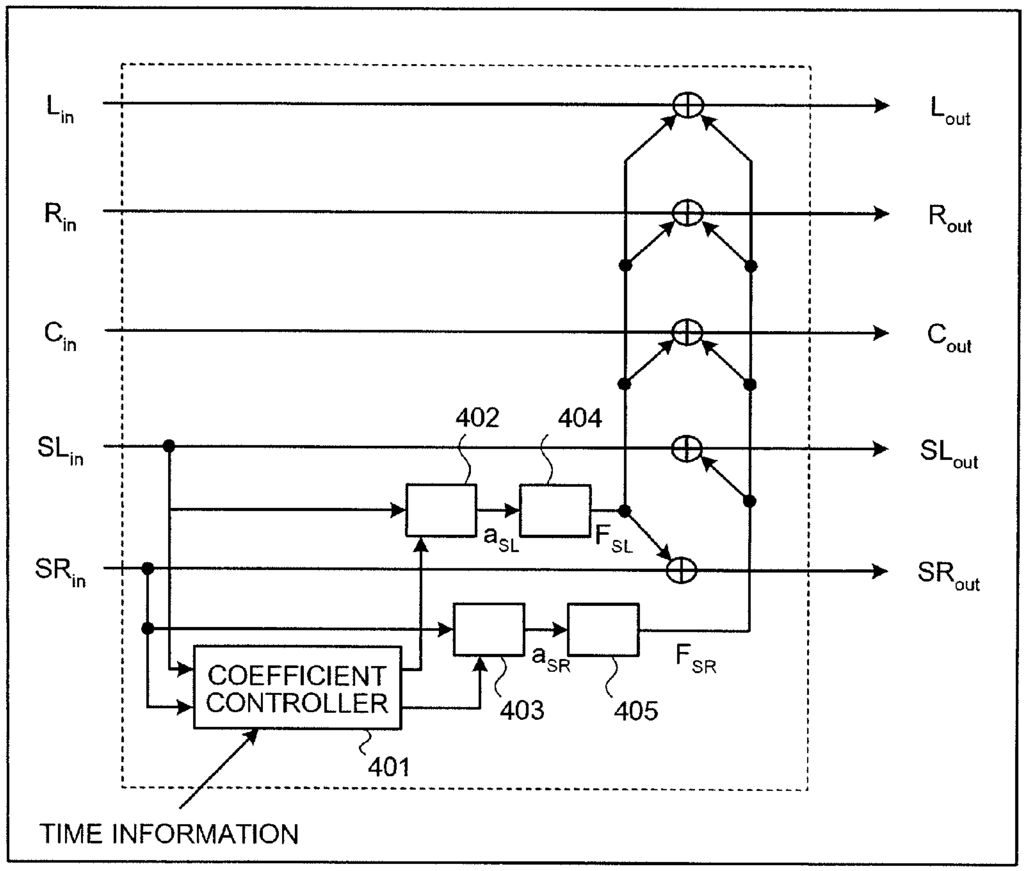
FIG. 4 is a block diagram of a signal processing flow inside a DSP.

FIG. 4 is a block diagram of a signal processing flow inside the DSP. Shown here is the signal processing flow in the case of 5-channel input from the sound source 301 to the DSP 302. Specifically, signals of the front left channel ($L_{in}$), the front right channel ($R_{in}$), the center channel ($C_{in}$), the surround left channel ($SL_{in}$), and the surround right channel ($SR_{in}$) are input. Signals of the front left channel ($L_{out}$), the front right channel ($R_{out}$), the center channel ($C_{out}$), the surround left channel ($SL_{out}$), and the surround right channel ($SR_{out}$) are output, respectively.

Firstly, a surround left ($SL_{in}$) component and a surround right ($SR_{in}$) component are input to a coefficient controller 401. Next, the coefficient controller 401 analyzes the surround left ($SL_{in}$) component and the surround right ($SR_{in}$) component. The coefficient controller 401, based on results of analysis, calculates distribution amounts $a_{SL}$ and $a_{SR}$ to other channels. Outputs from the coefficient controller 401 are updated by analyzing the sound components, as required.

Multiplying units 402 and 403 multiply the calculated distribution amounts $a_{SL}$ and $a_{SR}$ by the surround components. The distribution amount $a_{SL}$ is multiplied by the surround left component and the distribution amount $a_{SR}$ is multiplied by the surround right component. Then, with effects (F) of the equalizer, reverberator, etc., added at a filter 404, the multiplied distribution amounts are distributed to other channels.

For example, in the case of calculating the distribution amount $a_{SL}$ of the surround left component, distribution is to the front left channel ($L_{in}$), the front right channel ($R_{in}$), the center channel ($C_{in}$), and the surround right channel ($SR_{in}$). For example, in the case of calculating the distribution amount $a_{SR}$ of the surround right component, distribution is to the front left channel ($L_{in}$), the front right channel ($R_{in}$), the center channel ($C_{in}$), and the surround left channel ($SL_{in}$). As a result of the distribution, the signals are output of the front left channel ($L_{out}$), the front right channel ($R_{out}$), the center channel ($C_{out}$), the surround left channel ($SL_{out}$), and the surround right channel ($SR_{out}$), respectively.

Configuring the DSP 302 as shown in FIG. 4 enables adding the sound effects only to components than other the music among the sound components in a DVD concert disk. By designing the coefficient controller 401 so as to extract a component having a high probability of not being music and assigning this extracted component to the front channel, for example, the ambience of listening to live music and being surrounded by hand-clapping may be enjoyed. Also, in television broadcasting of a baseball game, by reproducing the sound characteristics of group of supporting fans (for example, cheering trumpet sound and shouts of joy), etc., at a slightly higher volume from the surroundings, the ambience of watching the baseball game in the midst of the cheering fans may be enjoyed.

Figure 5:
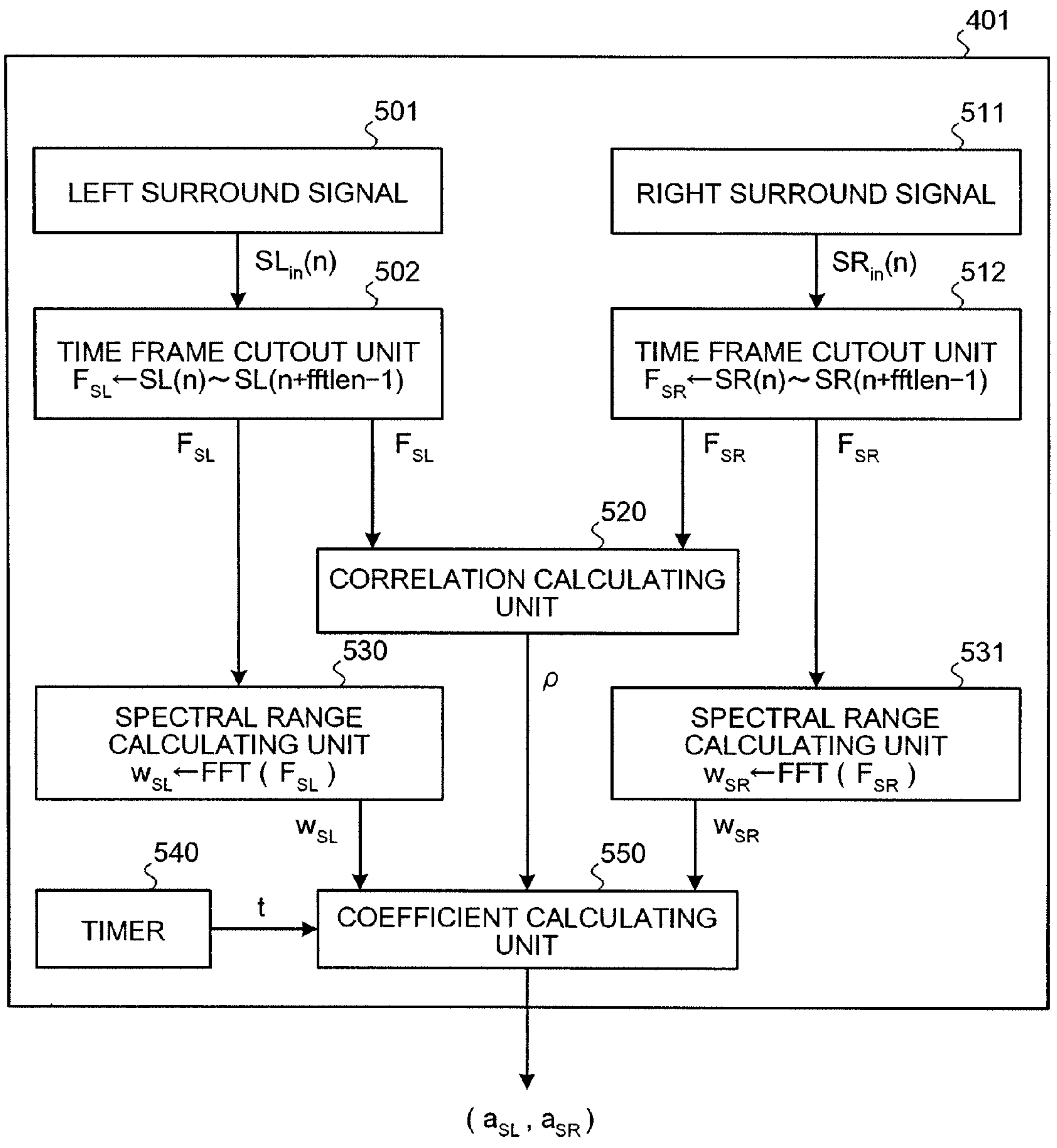
FIG. 5 is a block diagram of a functional configuration of a coefficient controller.

FIG. 5 is a block diagram of a functional configuration of the coefficient controller. Sampled 2-channel surround signals $SL_{in}(n)$ and $SR_{in}(n)$ are input to the coefficient controller 401. A left surround signal 501[$SL_{in}(n)$] is input to a time frame cutout unit 502 and a right surround signal 511[$SR_{in}(n)$] is input to a time frame cutout unit 512.

The time frame cutout units 502 and 512 window surround signals $SL_{in}(n)$ and $SR_{in}(n)$, respectively, in a time scale and cut out signals $F_{SL}$ and $F_{SR}$, respectively. Here, the frame length of the cutout signals $F_{SL}$ and $F_{SR}$ is given as fftlen.

A correlation calculating unit 520 calculates a correlation value ρ of the cutout signals $F_{SL}$ and $F_{SR}$. On the other hand, a spectral range calculating units 530 and 531 calculate spectral ranges $W_{SL}$ and $W_{SR}$, respectively, of the cutout signals $F_{SL}$ and $F_{SR}$. The spectral range calculating units 530 and 531 calculate the spectral ranges $W_{SL}$ and $W_{SR}$ by counting the number of lines of amplitude exceeding a certain threshold, out of an amplitude spectrum obtained by applying FFT to a signal sequence. The spectral ranges $W_{SL}$ and $W_{SR}$, which come infinitely close to the length fftlen, for example, in a wide-band signal such as white noise, may be considered to be an index of whiteness. A coefficient calculating unit 550 calculates the coefficient values $a_{SL}$ and $a_{SR}$ for assignment to other channels from the time t in one track obtained from a timer 540 in addition to the correlation value ρ and the spectral ranges $W_{SL}$ and $W_{SR}$. For example, equations (1) and (2) are used as calculating equations.

[Equation 1]

$$a_{SL} \propto \frac{W_L}{fftlen} \cdot \frac{1}{\rho} \cdot \left( \frac{1}{t_{end} - t} + \frac{1}{t} \right) \tag{1}$$

[Equation 2]

$$a_{SR} \propto \frac{W_R}{fftlen} \cdot \frac{1}{\rho} \cdot \left( \frac{1}{t_{end} - t} + \frac{1}{t} \right) \tag{2}$$

The intent of these equations includes the following three points: (1) In the case of a signal of a narrow bandwidth, the coefficients $a_{SL}$ and $a_{SR}$ are made smaller and conversely, in the case of a signal of a wide bandwidth, the coefficients $a_{SL}$ and $a_{SR}$ are made greater. (2) When the correlation is small, the coefficients $a_{SL}$ and $a_{SR}$ are made greater and conversely, when the correlation is great, the coefficients $a_{SL}$ and $a_{SR}$ are made smaller. (3) As the time is closer to the start or the end of the track, the coefficients $a_{SL}$ and $a_{SR}$ are made greater. Conversely, around the center of the track, the coefficients $a_{SL}$ and $a_{SR}$ are made smaller. $T_{end}$ represents the time length of one piece of music.

These equations utilize the characteristic that the signal of hand clapping, etc., with "wide bandwidth" and "low correlation between channels" is present "at the end or beginning of a piece of music". By distributing as much of such kind of a signal as possible to other channels, reproduction may be made of the ambience of being surrounded by hand clapping.

In equations (1) and (2), the left-hand side is a volume proportional to the right-hand side. Because of the diverse tastes of people, such as those who would like to listen concentrating on the music and others who would like to listen giving weight to the ambience, here, only the ratio of distribution is calculated by these equations. Thereafter, at the stage where the sound effects are added, the amount of distribution may be determined according to the taste of the user.

The output multiplied by the coefficient is output from the other channels. For example, the surround left signal ($SL_{in}$) multiplied by the coefficient is output from speakers other than the SL speaker. By outputting the signals with the sound effects added and a direct sound component through separate speakers, coloration is reduced as much as possible. Having the sound output from various directions has also a secondary effect of being capable of outputting a more natural and extensive sound.

Figure 6:
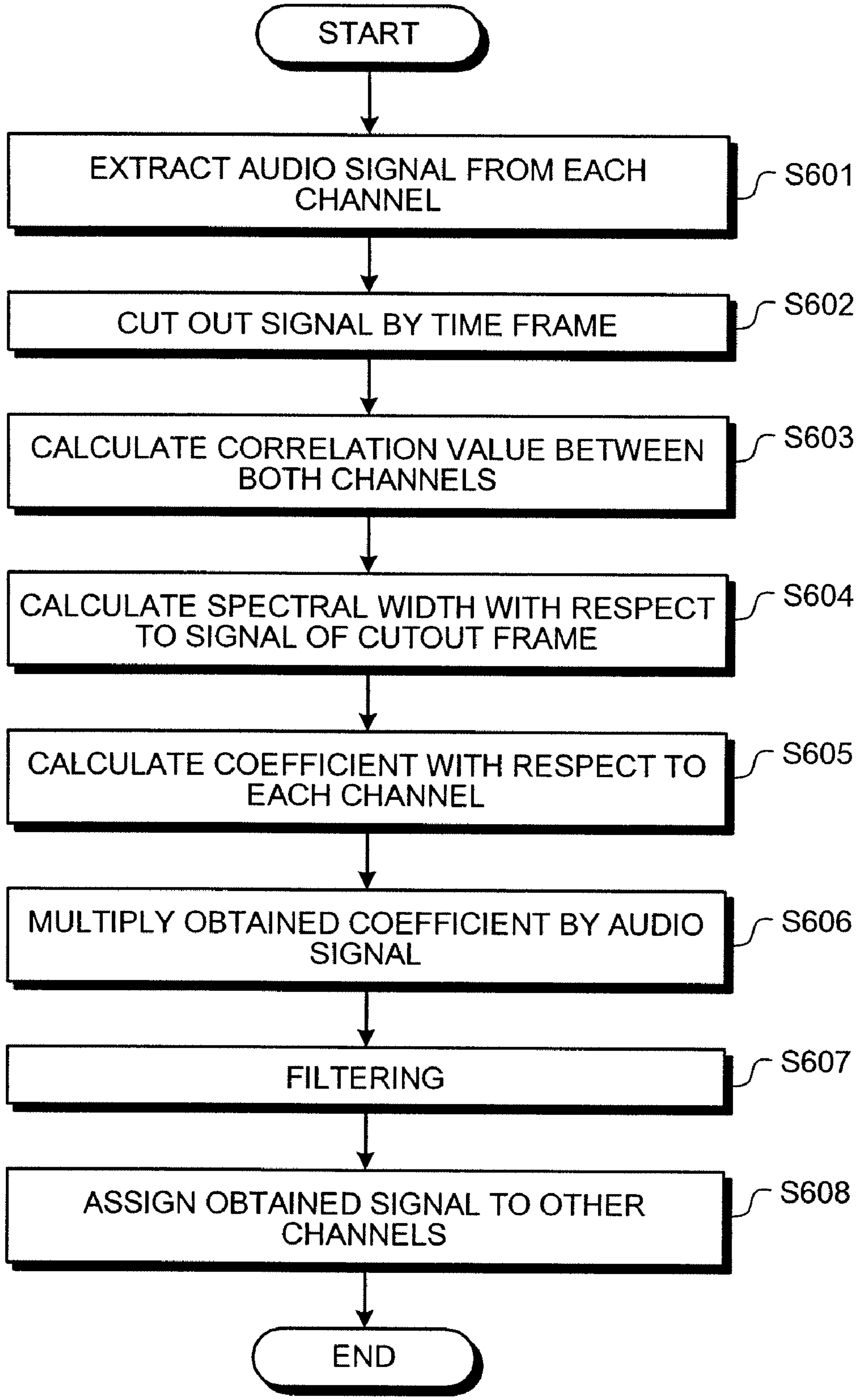
FIG. 6 is a flowchart of processing of the audio signal processing method.

FIG. 6 is a flowchart of processing of the audio signal processing method. Firstly, the surround signal from each channel is extracted (step S601). Next, the time frame cutout units 502 and 512 cut out the signal by the time frame (step S602). Then, the correlation calculating unit 520 calculates the correlation value ρ between both channels (step S603). The spectral range calculating units 530 and 531 calculate the spectral range $W_{SL}$ and $W_{SR}$ with respect to the signals of the cut out frame (step S604). Then, the coefficient calculating unit 550 calculates the coefficients $a_{SL}$ and $a_{SR}$ with respect to respective channels (step S605).

Then, the multiplying units 402 and 403 multiply the coefficients $a_{SL}$ and $a_{SR}$ by the surround signals $SL_{in}(n)$ and $SR_{in}(n)$ (step S606), respectively. The multiplied signals are filtered by the filters 404 and 405 (step S607), the obtained signals are assigned to other channels (step S608), and a sequence of processing is finished.

Configuration may be such that the output of the calculated coefficient is filtered by a smoothing filter such as a low-pass filter. Since the correlation value, a spectrum pattern, etc., vary at every moment, variation of the coefficient actually is considerably large. For this reason, the energy of the signal to be assigned to other channels, if directly applied, has a wide range of variation and large dispersion, resulting in an unstable signal level. By smoothing the output of the coefficient, the variation of the coefficient becomes smooth and the instability is eliminated.

Although described above, the coefficient is generated with respect to the two channels of the surround left and right, the coefficient may also be generated with respect to two front channels, or the coefficient may also be generated with respect to four channels of the front left and right channels and the surround left and right channels. In this case, in the case of 2 channels such as in a CD, the coefficient is generated with respect to one set of the right and left channels. While it is generally said that the components other than the music, such as hand clapping, are put in the surround components, frequently is the case that such components are put in the front components as well. By monitoring the signals of components other than the surround components, a reproduction method is enabled that is rich in variety.

Configuration may be such that the coefficients and content of processing with respect to the signals $F_{SL}$ and $F_{SR}$ are changed depending on the outputting speaker 306. By changing the coefficient for each outputting speaker 306 and making the signals less correlative, more expansive expression of the sound field may be achieved.

Second Example

Figure 7:
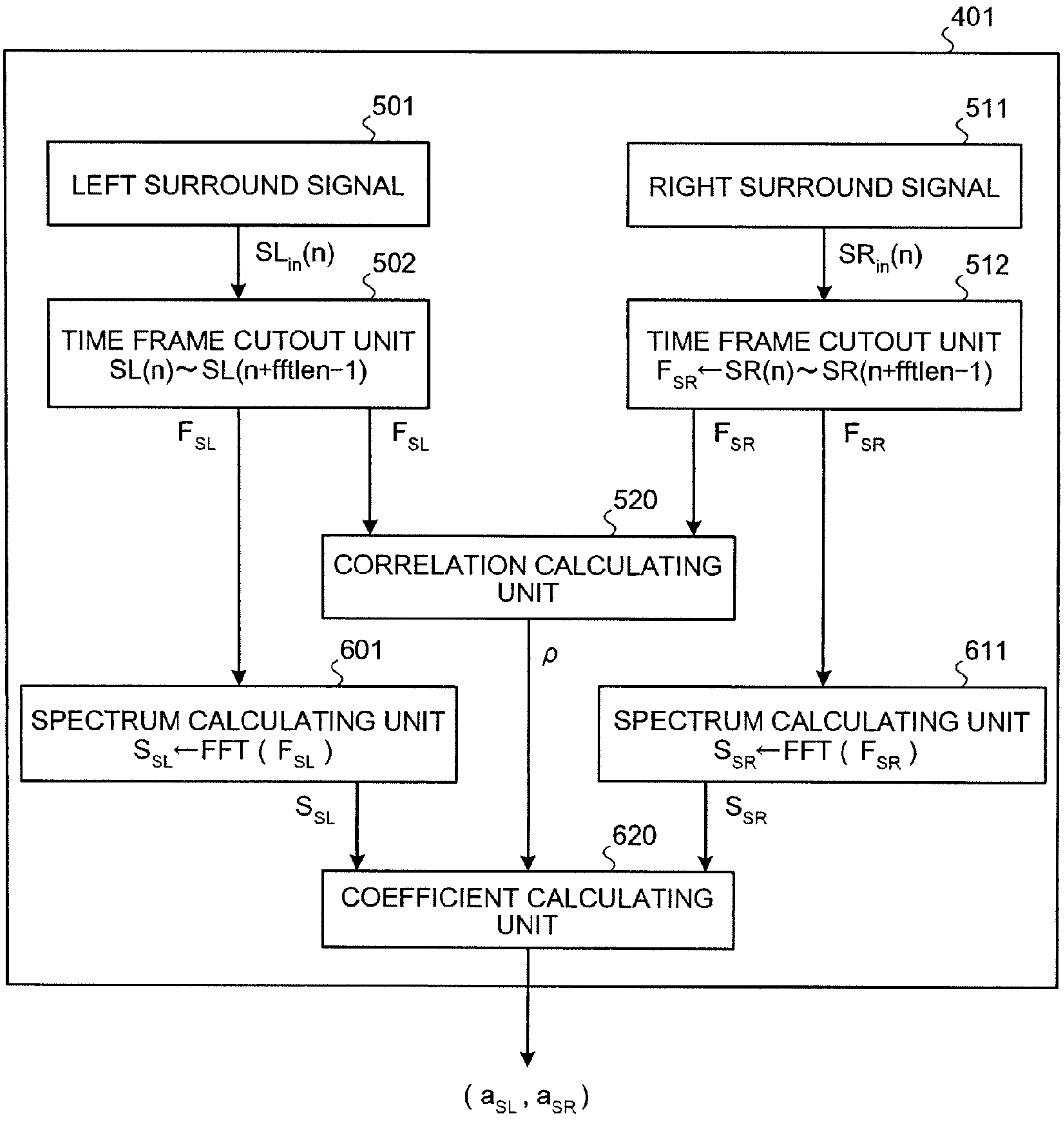
FIG. 7 is a block diagram of a functional configuration of the coefficient controller according to a second example.

FIG. 7 is a block diagram of a functional configuration of the coefficient controller according to a second example. In the same way as in the case of FIG. 5, sampled 2-channel surround signals $SL_{in}(n)$ and $SR_{in}(n)$ are input to the coefficient controller 401. The left surround signal 501$[SL_{in}(n)]$ is input to the time frame cutout unit 502 and the right surround signal 511$[SR_{in}(n)]$ is input to the time frame cutout unit 512.

The time frame cutout units 502 and 512 window the surround signals $SL_{in}(n)$ and $SR_{in}(n)$, respectively, in a time scale and cut out the signals $F_{SL}$ and $F_{SR}$ with the frame length of fftlen, respectively.

The correlation calculating unit 520 calculates the correlation value ρ of the cutout signals $F_{SL}$ and $F_{SR}$. On the other hand, spectrum calculating units 601 and 611 calculate spectra $S_{SL}$ and $S_{SR}$, respectively, of the cutout signals $F_{SL}$ and $F_{SR}$. A coefficient calculating unit 620 calculates the coefficient values $a_{SL}$ and $a_{SR}$ for assignment to other channels from the correlation value ρ and the spectra $S_{SL}$ and $S_{SR}$. For example, equations (3) and (4) are used as calculating equations.

[Equation 3]

$$a_{SL} \propto \cdot \frac{1}{\rho} \cdot \frac{1}{|S_{SL} - S_{taget}|} \tag{3}$$

[Equation 4]

$$a_{SR} \infty \cdot \frac{1}{\rho} \cdot \frac{1}{|S_{SR} - S_{taget}|} \tag{4}$$

The intent of these equations includes the following two points: (1) When the spectrum is distant from a spectrum target, the coefficients $a_{SL}$ and $a_{SR}$ are made smaller and conversely, when the spectrum is close to the spectrum target, the coefficients $a_{SL}$ and $a_{SR}$ are made greater. (2) When the correlation is small, the coefficients $a_{SL}$ and $a_{SR}$ are made greater and conversely, when the correlation is great, the coefficients $a_{SL}$ and $a_{SR}$ are made smaller.

Instead of calculating the spectral range by the spectral range calculating units 530 and 531, configuration may be such that the spectrum calculating units 601 and 611, using an FFT spectrum, calculate the spectrum in such a manner that higher weighting is given when the spectrum is close to a particular spectrum. In this example, in consideration of the audio signal of a television, etc., which is not divided by track, the time information is not used. Of course, in the case of the package medium such as the DVD, the time information may be inserted as in the calculating method of the first embodiment.

In this case, there are a number of sounds that give the ambience of being present at an event, such as the yells of cheering, etc., and cheering trumpets while watching a baseball game in addition to hand clapping. This example, by focusing only on the sound of a characteristic spectrum, also enables giving the ambience of being surrounded by a sound source.

The examples described above analyze the sound source with the two channel signals used as a pair, thereby enabling extraction of components other than the music and increasing the ambience of being present at the event. The sound effects may also be applied to other than the equalizer. Here, the sound effects may more suitably be used in combination with the effect of creating the ambience of the event by the reverberator, etc.

Generally, in the sound components of the 5.1 channel, etc., other than the sound to be definitely oriented at the rear, non-correlated signals are often inserted to give the ambience of a live music hall. Accordingly, by examining the correlation of surround components of two channels, desired sound may be oriented at the front. The calculation based on the spectral range, the time information, and the correlation value enables enhanced accuracy.

Typical sound processing by the equalizer or reverberator, when applied to the music itself, makes the sound unnatural at times. In contrast, these examples enable processing only the component that gives the ambience of a live music hall.

Conventionally, the object of the equalizer is to arrange the transfer characteristics from a speaker to a listener. The embodiment aims mainly at adding sound effects to components other than the music. However, application of the embodiment is not limited to the equalizer. For more realistic ambience of the event, it may be conceivable to combine the equalizer with, for example, a reverberator control, etc.

The above embodiment may be applied to home or car audio equipment (especially, surround sound reproducing equipment), television sets (especially, those compliant with terrestrial broadcasting and surround sound reproduction), and auxiliary music equipment for concert halls and live music halls The audio signal processing method explained in the present embodiment can be implemented by a computer such as a personal computer and a workstation executing a program that is prepared in advance. The program is recorded on a computer-readable recording medium such as a hard disk, a flexible disk, a CD-ROM, an MO, and a DVD, and is executed by being read out from the recording medium by a computer. The program can be a transmission medium that can be distributed through a network such as the Internet.

The above embodiments enable adding the sound effects only to the components other than the music, out of the sound components, for example, in the DVD live music disk, etc. By designing the coefficient controller so as to extract such components that have a high probability of being other than the music and assigning such components to the front channels, the atmosphere, for example, of listening to the live music surrounded by the hand clapping may be enjoyed. Also, in the television broadcasting of a baseball game, by reproducing the sound characteristic of a cheering party (for example, cheering trumpet sound and shouts of joy), etc., in a little greater volume from the surrounding, the atmosphere may be enjoyed of watching the baseball game in the midst of the cheering crowd.

The invention claimed is:

1. An audio signal processing apparatus comprising:

a cutout unit that cuts out, by a time frame, a plurality of audio signals corresponding to a plurality of channels;

a correlation calculating unit that calculates a correlation value between each of the audio signals of the channels included in a given time frame cut out by the cutout unit;

a spectrum calculating unit that calculates spectrum information indicative of a spectral characteristic of the audio signal of a given channel cut out by the cutout unit;

a coefficient calculating unit that calculates, based on the correlation value and the spectrum information, a coefficient to be multiplied by the audio signal of the given channel; and an assigning unit that multiplies the coefficient by the audio signal of the given channel and assigns a multiplied signal that results to the channels excluding the given channel.

2. The audio signal processing apparatus according to claim 1, wherein the coefficient is a value inversely proportional to the correlation value.

3. The audio signal processing apparatus according to claim 1, wherein the cutout unit cuts out the audio signals of the channels by windowing in a time scale.

4. The audio signal processing apparatus according to claim 1, wherein the spectrum calculating unit calculates a spectral range of the audio signal of the given channel.

5. The audio signal processing apparatus according to claim 4, wherein the coefficient is a value proportional to a quotient of the spectral range divided by a time length of the time frame.

6. The audio signal processing apparatus according to claim 4, wherein the coefficient is a value proportional to a sum of a reciprocal of an elapsed time from a start point of the time frame and a reciprocal of a remaining time to an end point of the time frame.

7. The audio signal processing apparatus according to claim 1, wherein the spectrum calculating unit calculates a spectrum of the audio signal of the given channel.

8. The audio signal processing apparatus according to claim 7, wherein the coefficient is a value inversely proportional to a difference of the spectrum of the audio signal of the given channel and a target spectrum.

9. The audio signal processing apparatus according to claim 1, wherein the audio signals of the channels include signals of a front left channel, a front right channel, a center channel, a surround left channel, and a surround right channel, and the given channel is the surround left channel or the surround right channel.

10. An audio signal processing method comprising:

cutting out a plurality of audio signals corresponding to a plurality of channels by a time frame;

calculating a correlation value between each of the audio signals of the channels included in a given time frame cut out by the cutout unit;

calculating spectrum information indicative of a spectral characteristic of the audio signal of a given channel cut out by the cutout unit;

calculating, based on the correlation value and the spectrum information, a coefficient to be multiplied by the audio signal of the given channel;

multiplying the coefficient by the audio signal of the given channel; and assigning, to the channels excluding the given channel, a multiplied signal obtained at the multiplying.

11. A computer-readable recording medium that stores therein an audio signal processing program that causes a computer to execute:

cutting out a plurality of audio signals corresponding to a plurality of channels by a time frame;

calculating a correlation value between each of the audio signals of the channels included in a given time frame cut out by the cutout unit;

calculating spectrum information indicative of a spectral characteristic of the audio signal of a given channel cut out by the cutout unit;

calculating, based on the correlation value and the spectrum information, a coefficient to be multiplied by the audio signal of the given channel;

multiplying the coefficient by the audio signal of the given channel; and assigning, to the channels excluding the given channel, a multiplied signal obtained at the multiplying.

12. The audio signal processing method according to claim 10, wherein the assigning, to the channels excluding the given channel, is performed by a processor.

13. The computer-readable recording medium according to claim 11, wherein the recording medium is non-transitory.

* * * * *